United States Patent
Sharon et al.

(10) Patent No.: US 10,198,315 B2
(45) Date of Patent: Feb. 5, 2019

(54) NON-VOLATILE MEMORY WITH CORRUPTION RECOVERY

(71) Applicant: SANDISK TECHNOLOGIES LLC, Addison, TX (US)

(72) Inventors: Eran Sharon, Rishon Lezion (IL); Idan Alrod, Herzliya (IL)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/056,070

(22) Filed: Feb. 29, 2016

(65) Prior Publication Data

US 2017/0249207 A1 Aug. 31, 2017

(51) Int. Cl.
| | | |
|---|---|---|
| *G06F 11/10* | (2006.01) | |
| *G11C 29/04* | (2006.01) | |
| *H03M 13/09* | (2006.01) | |
| *G11C 29/52* | (2006.01) | |
| *H03M 13/29* | (2006.01) | |

(52) U.S. Cl.
CPC ...... *G06F 11/1068* (2013.01); *G06F 11/1004* (2013.01); *G06F 11/1044* (2013.01); *G11C 29/52* (2013.01); *H03M 13/09* (2013.01); *H03M 13/2906* (2013.01); *G06F 11/1008* (2013.01); *G06F 11/1048* (2013.01); *G11C 2029/0409* (2013.01)

(58) Field of Classification Search
CPC ............ G06F 11/1068; G06F 11/1004; G06F 11/1008; G06F 11/1044; G06F 11/1048; H03M 13/2906; H03M 13/09; G11C 29/52
USPC ........................................................ 714/763
See application file for complete search history.

(56) References Cited

U.S. PATENT DOCUMENTS

| | | | |
|---|---|---|---|
| 4,183,463 A | 1/1980 | Kemmetmueller | |
| 7,124,348 B2 * | 10/2006 | Nicolaidis | G06F 11/1008 714/767 |
| 7,345,928 B2 | 3/2008 | Li | |
| 7,409,625 B2 | 8/2008 | Corbett | |
| 7,552,357 B2 * | 6/2009 | Grcanac | G06F 11/1076 714/6.12 |
| 7,665,009 B2 * | 2/2010 | Kobayashi | G06F 11/1008 714/758 |
| 8,015,472 B1 | 9/2011 | Corbett | |
| 8,307,271 B1 * | 11/2012 | Liu | G06F 11/1004 714/807 |

(Continued)

*Primary Examiner* — James C Kerveros
(74) *Attorney, Agent, or Firm* — Vierra Magen Marcus LLP

(57) ABSTRACT

A non-volatile storage system is provided that includes a mechanism to restore data that has been corrupted beyond the limits of traditional error correction. The system creates first level parity information for each subset of data to form multiple sets of programmable data, with each set of programmable data including a subset of data and corresponding first level parity. Separate second level parity is created for each set of programmable data. The system creates combined second level parity information based on a function of separate second level parity information for the multiple sets of programmable data. If a set of programmable data is found to be corrupt, the corrupt subset of data is recovered using the corrupt subset of data read from the non-volatile storage system, the corresponding first level parity read from the non-volatile storage system and the combined second level parity information.

15 Claims, 13 Drawing Sheets

(56) References Cited

U.S. PATENT DOCUMENTS

| | | |
|---|---|---|
| 8,321,597 B2 | 11/2012 | Yu |
| 8,379,454 B2 | 2/2013 | Kochar |
| 8,397,107 B1* | 3/2013 | Syu .................... G06F 11/1012 |
| | | 711/154 |
| 8,402,217 B2* | 3/2013 | Burd .................... G06F 11/1028 |
| | | 365/185.33 |
| 8,464,093 B1* | 6/2013 | Swenson ............... G06F 11/108 |
| | | 714/5.1 |
| 8,484,408 B2 | 7/2013 | Hetzler |
| 8,484,533 B2 | 7/2013 | Olbrich |
| 8,504,904 B2* | 8/2013 | Aston ................. G06F 11/1004 |
| | | 714/807 |
| 8,700,951 B1* | 4/2014 | Call .................... G06F 11/1441 |
| | | 714/22 |
| 8,730,722 B2 | 5/2014 | Koh |
| 8,732,553 B2* | 5/2014 | Nagadomi .......... G06F 11/1048 |
| | | 714/755 |
| 8,775,901 B2 | 7/2014 | Sharon |
| 8,949,687 B2* | 2/2015 | Seo ......................... H03M 7/30 |
| | | 714/763 |
| 8,996,951 B2* | 3/2015 | Hyde ................. G06F 11/0703 |
| | | 711/103 |
| 9,021,333 B1* | 4/2015 | Northcott .............. G06F 11/073 |
| | | 714/766 |
| 9,036,416 B2 | 5/2015 | Mokhlesi |
| 9,152,497 B2 | 10/2015 | Lee |
| 9,183,085 B1* | 11/2015 | Northcott ............ G06F 11/1068 |
| 9,202,593 B1 | 12/2015 | Magia |
| 2008/0065937 A1 | 3/2008 | Micheloni |
| 2009/0158086 A1 | 6/2009 | Kwon |
| 2010/0262894 A1 | 10/2010 | Swing |
| 2012/0254501 A1 | 10/2012 | Cho |
| 2013/0031429 A1 | 1/2013 | Sharon |
| 2015/0169420 A1 | 6/2015 | Shapira |
| 2015/0261460 A1 | 9/2015 | Liao |
| 2016/0180926 A1 | 6/2016 | Young |

* cited by examiner

|            | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

Fig. 7

| Header 802 | User Data 804 | 1L Parity 806 |
|---|---|---|

Fig. 8

| Page 1 | Separate 2L Parity for Page 1 |
|---|---|
| Page 2 | Separate 2L Parity for Page 2 |
| Page 3 | Separate 2L Parity for Page 3 |
| ⋮ | ⋮ |
| Page N | Separate 2L Parity for Page N |
|  | Combined 2L Parity |

NON-VOLATILE MEMORY WITH CORRUPTION RECOVERY

BACKGROUND

Physical defects in non-volatile memory, such shorts between neighboring word lines, shorts between a word line and the substrate, broken word lines, etc, may result in data corruption which is above the correction capability of the error correction codes ("ECC"), leading to data loss.

One approach is to preventing data loss is to try screening such memory defects during production via extensive memory tests that stress the memory in order to reveal these defects. Such extensive testing may increase the memory products cost significantly due to the high testing time, testing equipment cost and overkill yield loss. In addition, such production testing may not be able to provide sufficient defect detection and screening.

Another approach is based on RAID like mechanisms, which store XOR signatures of the data, that enable its recovery once corrupted as a result of a memory defect. Such mechanisms are very expensive, due to the required memory overprovisioning for storing the XOR signatures and due to the requirement for a very large Controller volatile memory DRAM for computing the XOR signatures over long data stripes. These schemes also involve high firmware complexity.

A third approach uses temporary XOR signatures computed across data from multiple memory dies & planes and stored in a small Controller volatile memory SRAM. After programming the data to the memory, the data is read and the data integrity is verified. In case data found to have been corrupted due to a physical memory defect, the data is recovered based on the XOR signatures stored in the Controller which are de-XORed with the uncorrupted data from the memory in order to reconstruct the corrupted data. In case no data corruption is encountered, the XOR signatures may be reset (ie deleted) once in a while and a new XOR signature will accumulate the next portion of data traffic.

This third approach can be used in low cost products. The amount of memory required in the Controller for storing the XOR signatures is equal to the amount of data pages that may be corrupt by a memory defect. For two dimensional NAND, a memory defect corrupts a relatively small number of data pages. For example, in a two dimensional NAND memory system that stores three bits of data per memory cell, a short between word lines can corrupt up to six data pages (located in the two adjacent shorted word lines). Hence, the memory requirements are relatively small and acceptable. For three dimensional memories, a physical defect in the memory may corrupt a significantly higher number of data pages. For example, in a three dimensional NAND memory system that stores three bits of data per memory cell, a short between word lines can corrupt up to twenty four data pages. This requires a very large memory in the Controller for storing the signatures and can become cost prohibitive for implementation in low cost products.

BRIEF DESCRIPTION OF THE DRAWINGS

Like-numbered elements refer to common components in the different figures.

FIG. 7 is a block diagram depicting a page of data.

FIG. 8 is a block diagram depicting s trip of data.

DETAILED DESCRIPTION

The amount of memory required by the approaches discussed above for storing an XOR signature is equal to (or related to) the amount of data pages that may be corrupt by a physical memory defect. This is based on the assumption that a physical memory defect completely corrupts the data in all pages that can be affected by the defect. However, this assumption is not accurate as a physical memory defect does not completely corrupt the data in all pages that can be affected by the defect. Therefore, a lower complexity recovery scheme can be used for three dimensional memories that requires less memory (volatile or non-volatile) for storing recovery information.

A non-volatile storage system is provided that includes a more efficient mechanism to recover data that has been corrupted beyond the limits of traditional error correction. The system creates first level parity information for each subset of data to form multiple sets of programmable data, with each set of programmable data including a subset of data and corresponding first level parity. Separate second level parity is created for each set of programmable data. The system creates combined second level parity information based on a function of separate second level parity information for the multiple sets of programmable data. The combined second level parity information is stored in the Controller or in the non-volatile storage. If a set of programmable data is found to be corrupt, the corrupt subset of data is recovered using the corrupt subset of data read from the non-volatile storage system, the corresponding first level parity for the corrupt subset of data read from the non-volatile storage system and the combined second level parity information.

The following discussion provides details of one example of a suitable structure for memory devices that can used with the proposed technology. Other structures can also be used to implement the proposed technology.

Figure 1:
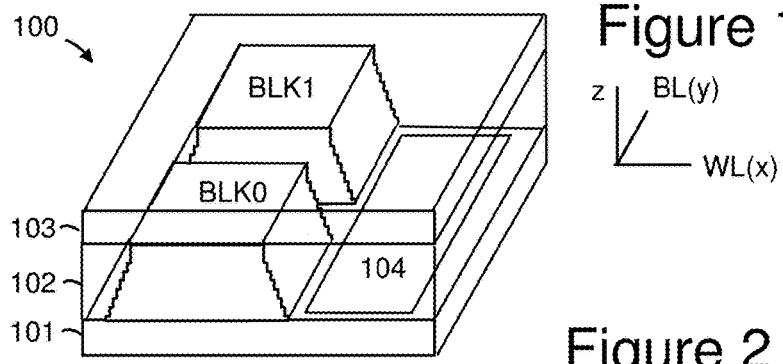
FIG. 1 is a perspective view of a 3D stacked non-volatile memory device.

FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
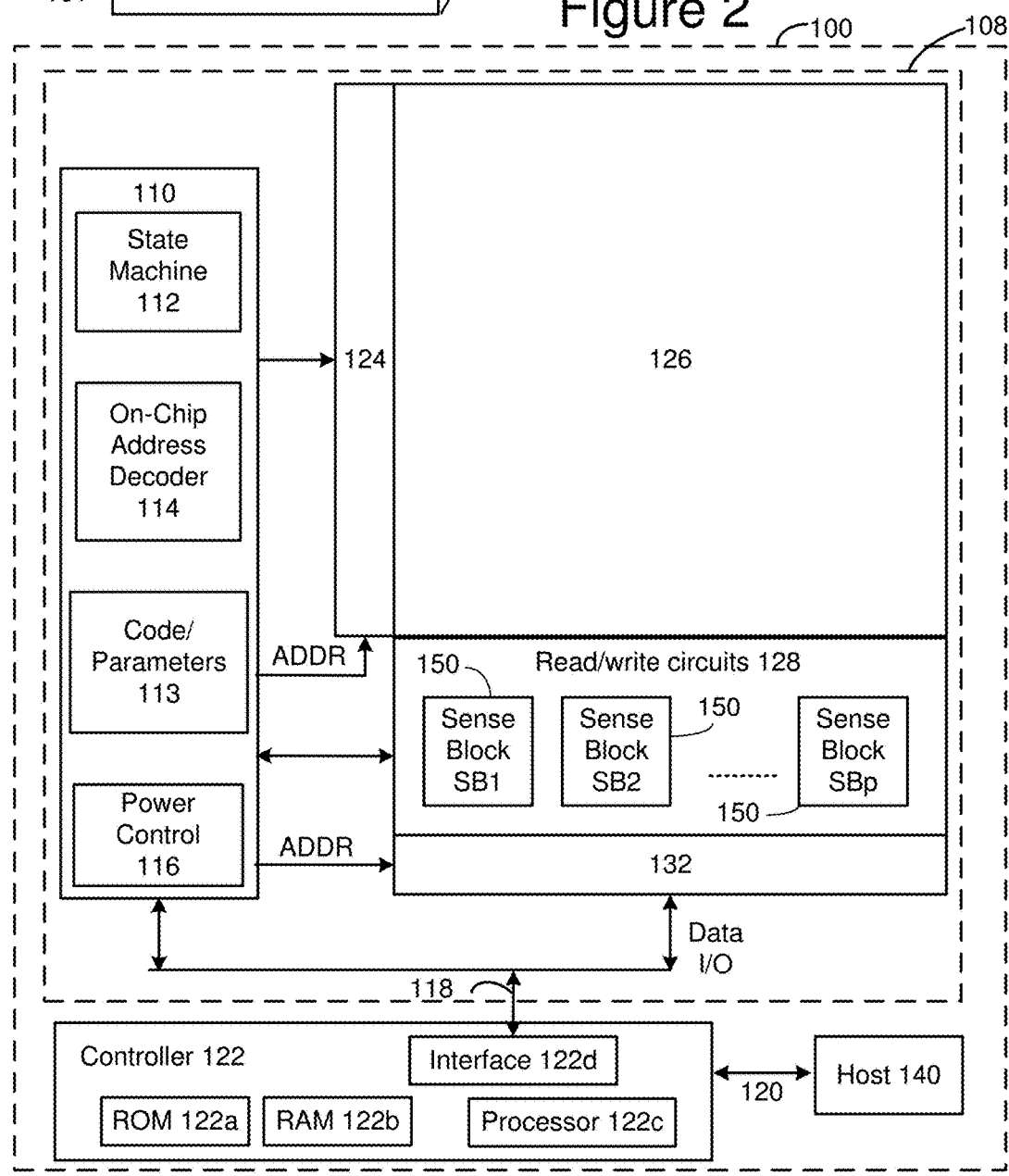
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device 100 (e.g., a removable storage card) as the one or more memory die 108. However, in other systems, the controller can be separated from the memory die 108. In some embodiments the controller will be on a different die than the memory die. In some embodiments, one Controller 122 will communicate with multiple memory die 108. In other embodiments, each memory die 108 has its own controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electrical circuits).

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks 150, read/write circuits 128, and Controller 122 can be considered one or more control circuits (or a managing circuit) that performs the functions described herein.

The (on-chip or off-chip) Controller 122 (which in one embodiment is an electrical circuit) may comprise a processor 122c, ROM 122a, RAM 122b and a Memory Interface 122d, all of which are interconnected. Processor 122C is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
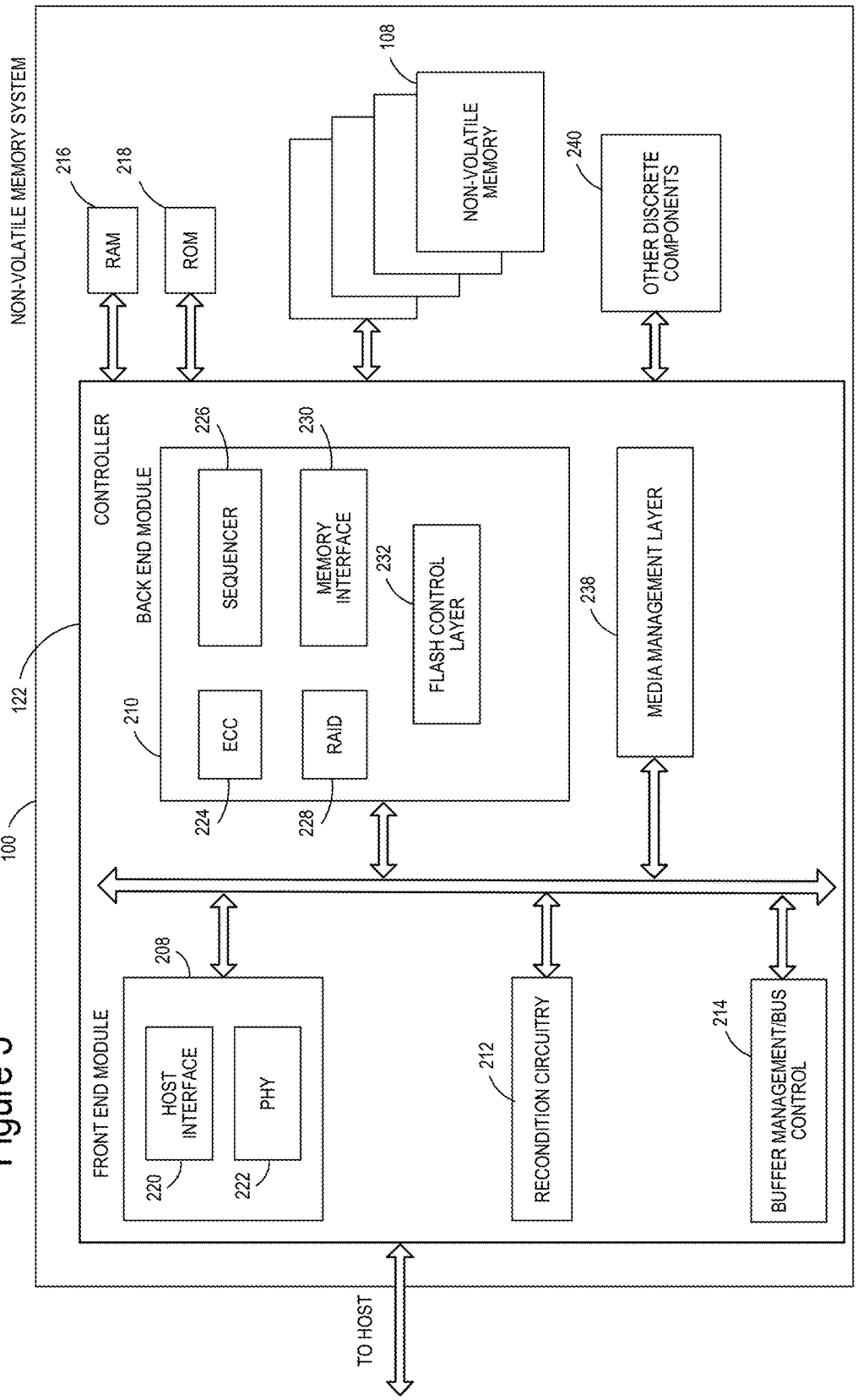
FIG. 3 is a block diagram depicting one embodiment of a controller.

FIG. 3 is a block diagram of example memory system 100, depicting more details of Controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, controller 112 includes a front end module 208 that interfaces with a host, a back end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for Controller 122 to perform the functions described herein. The architecture depicted in FIG. 3 is one example implementation that may (or may not) use the components of Controller 122 depicted in FIG. 2 (ie RAM, ROM, processor, interface).

Controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the Controller 122, a buffer manager/bus controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the controller. In yet other embodiments, portions of RAM and ROM may be located both within the Controller 122 and outside the controller. Further, in some implementations, the Controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

Figure 4:
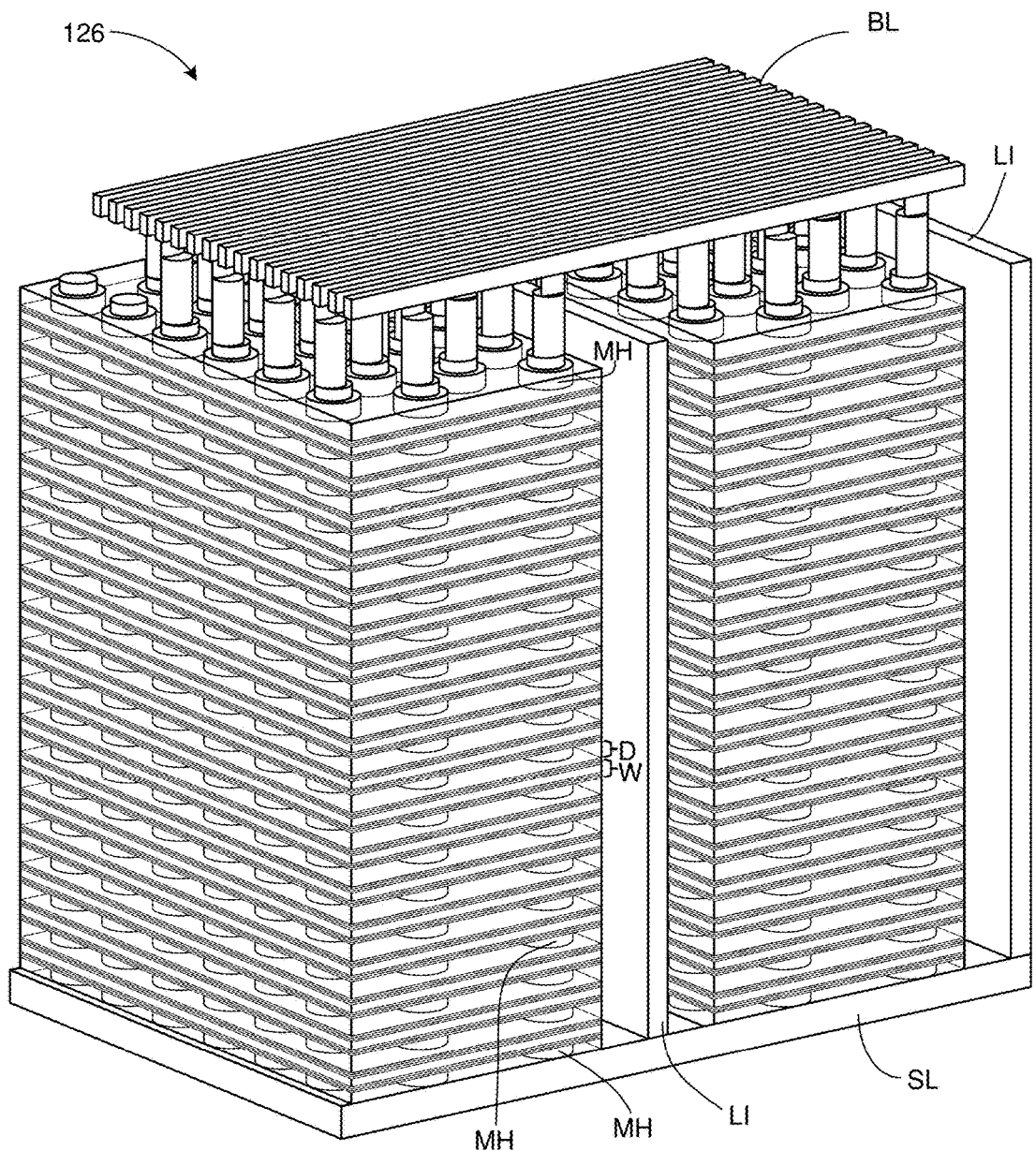
FIG. 4 is a perspective view of a portion of a three dimensional monolithic memory structure.

FIG. 4 is a perspective view of a portion of a three dimensional monolithic memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4G.

Figure 4A:
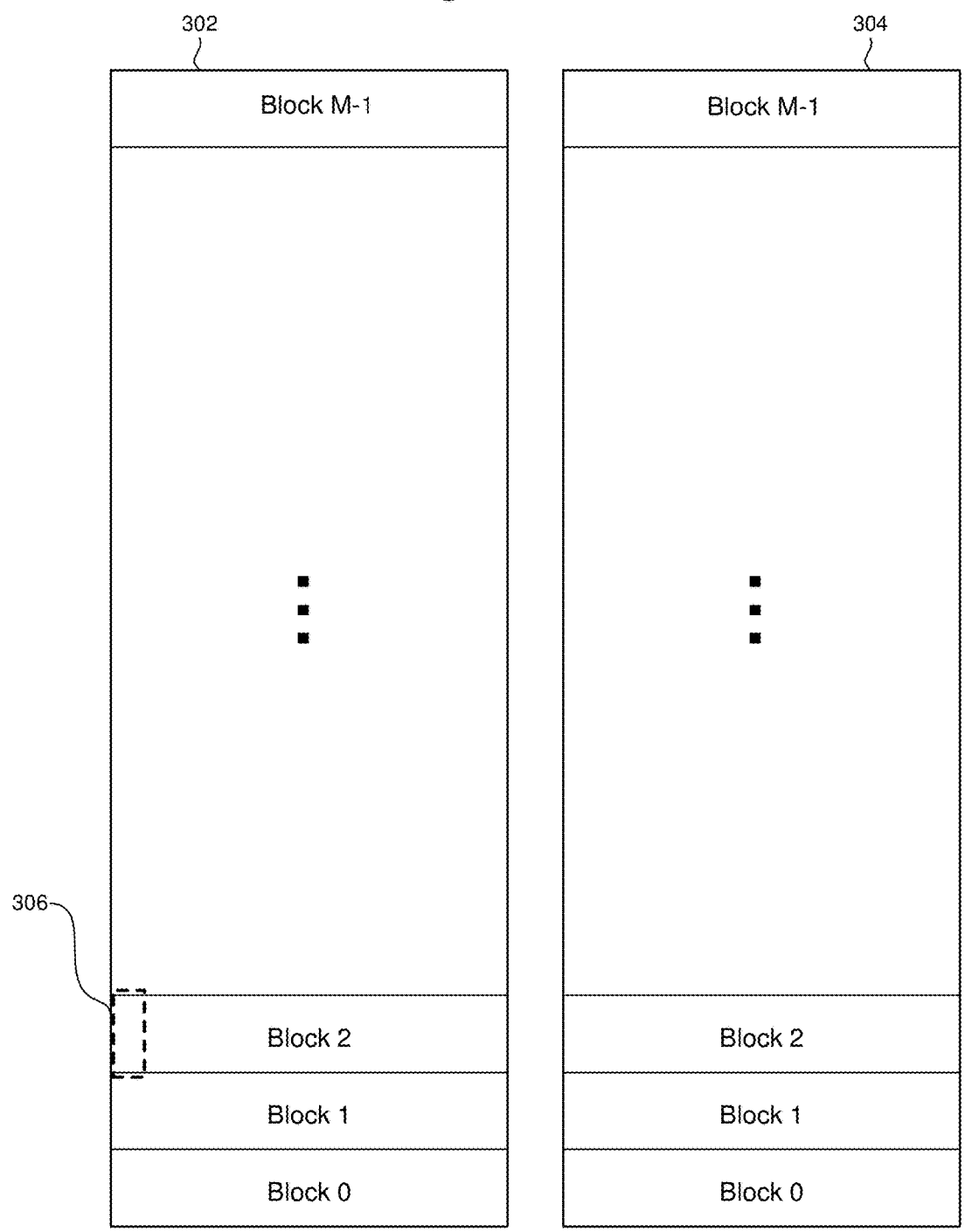
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . .

Figure 4B:
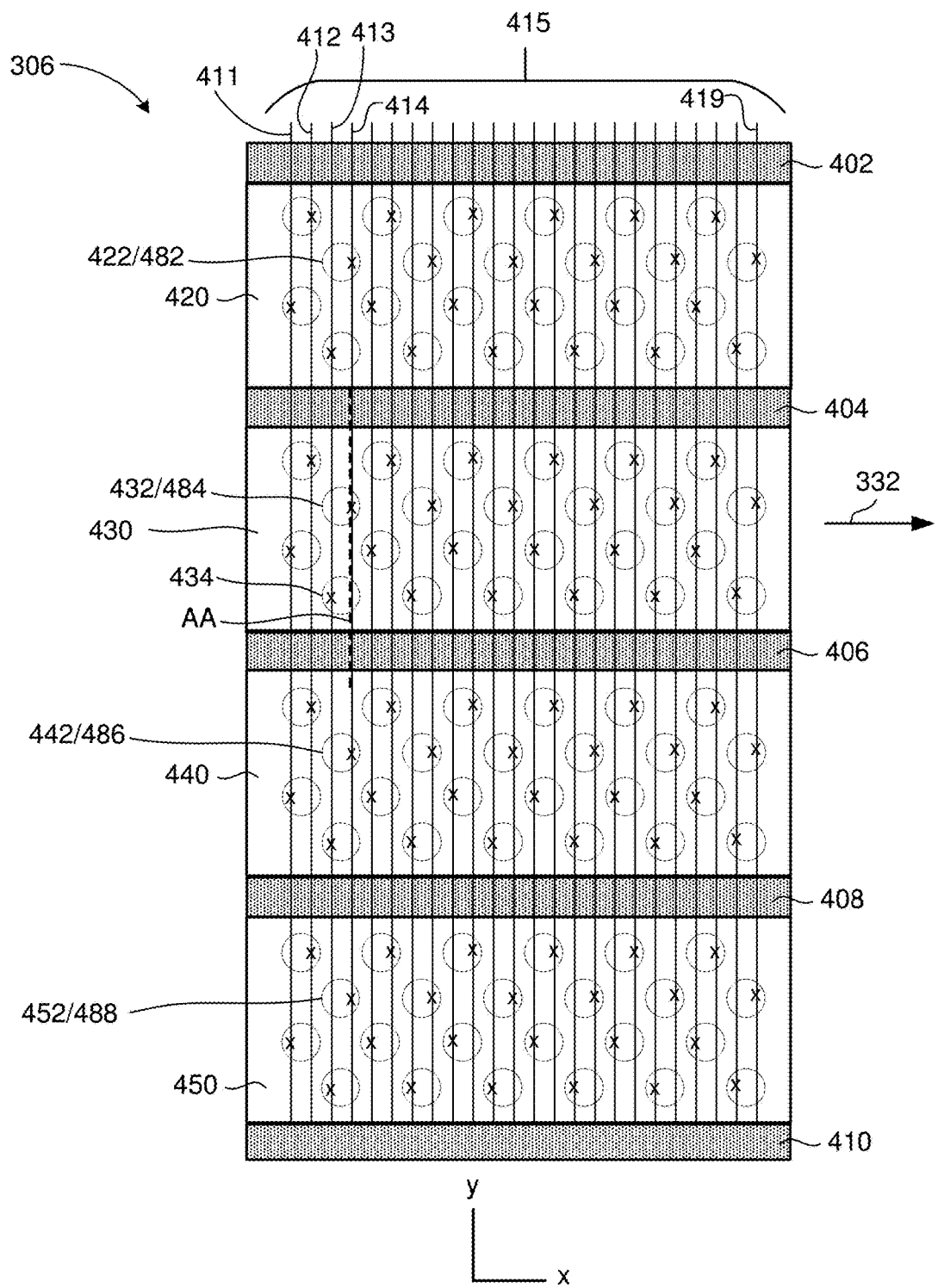
FIG. 4B depicts a top view of a portion of a block of memory cells.

FIGS. 4B-4E depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B

FIG. 4B also depicts a set of bit lines 415, including bit lines 411, 412, 413, 414, ... 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
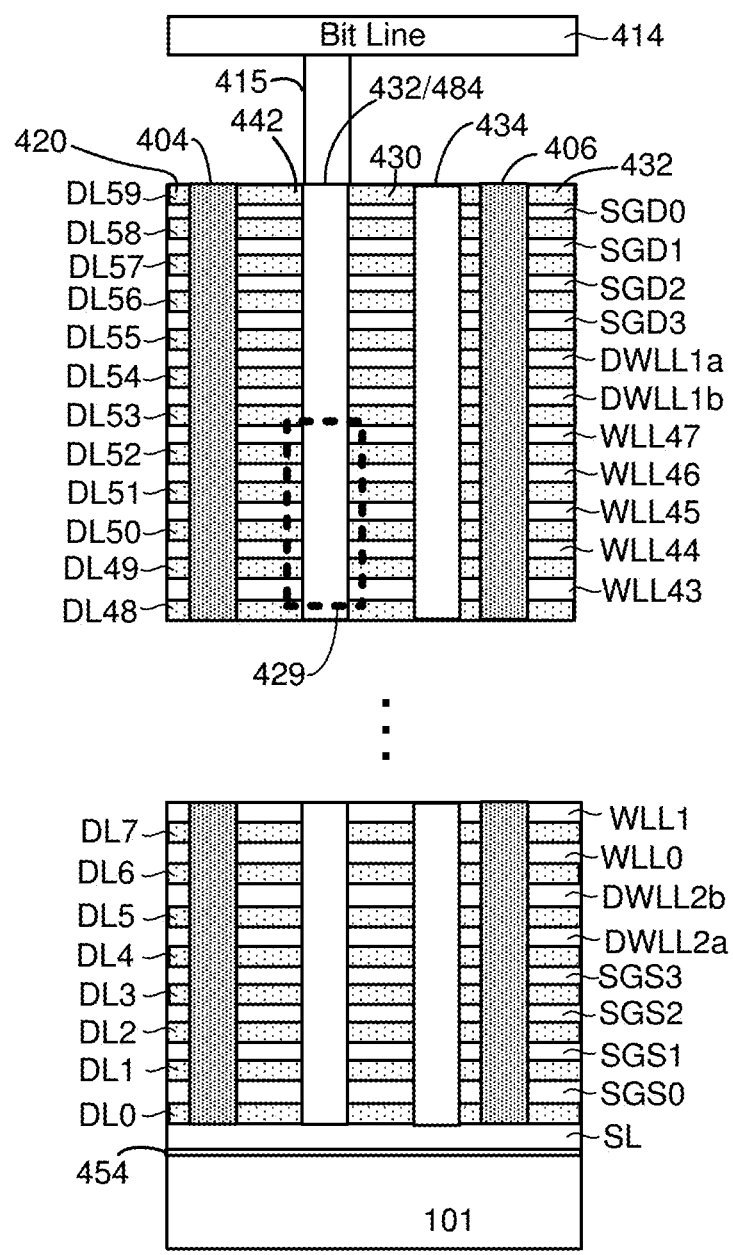
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DWLL1a, DWLL1b, DWLL2a and DWLL2b; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DWLL1a, DWLL1b, DWLL2a and DWLL2b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1a, DWLL1b, DWLL2a and DWLL2b connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Figure 4D:
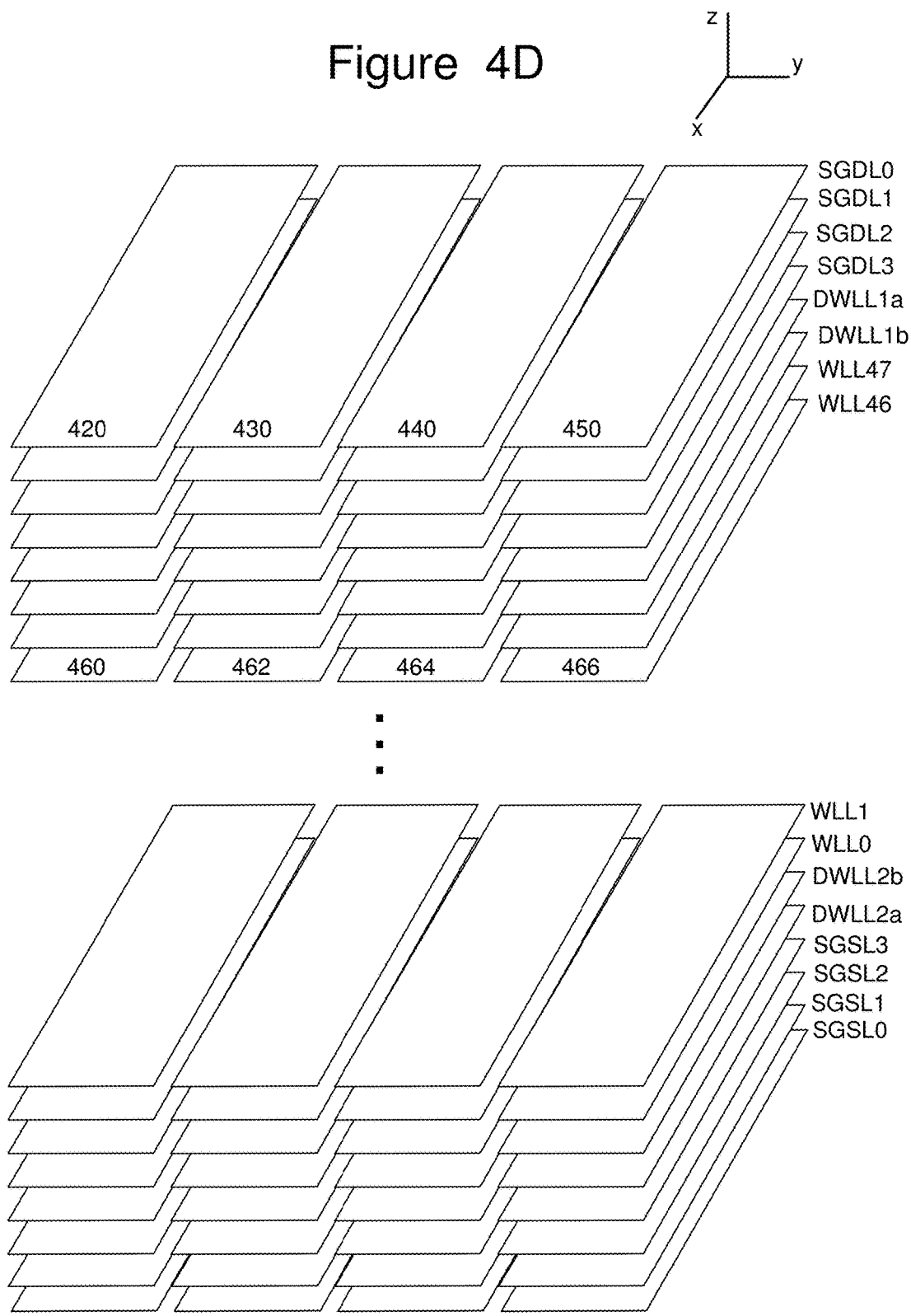
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DWLL1a, DWLL1b, DWLL2a, DWLL2b, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
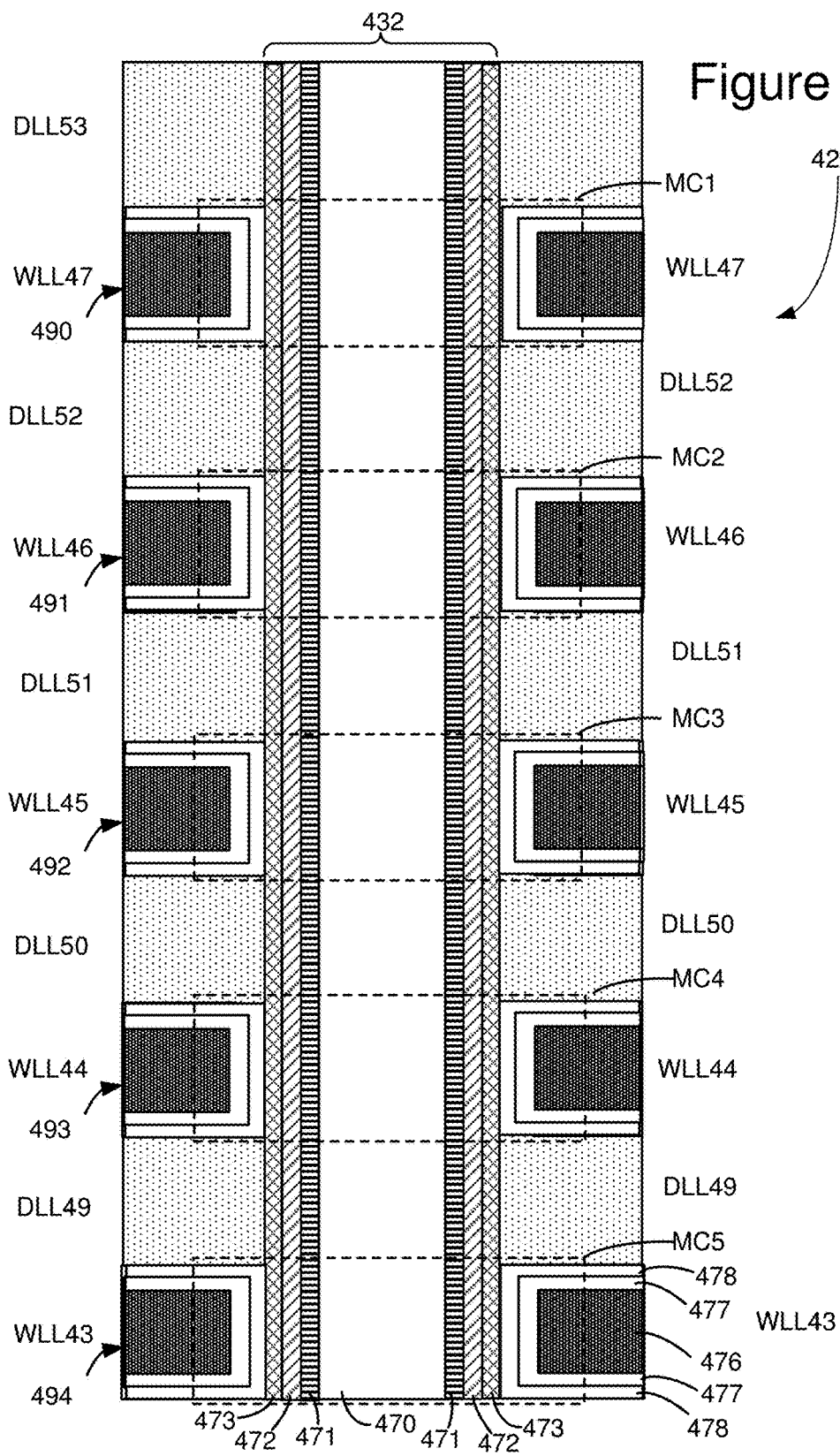
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Although the example memory system discussed above is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figures 5, 5A:
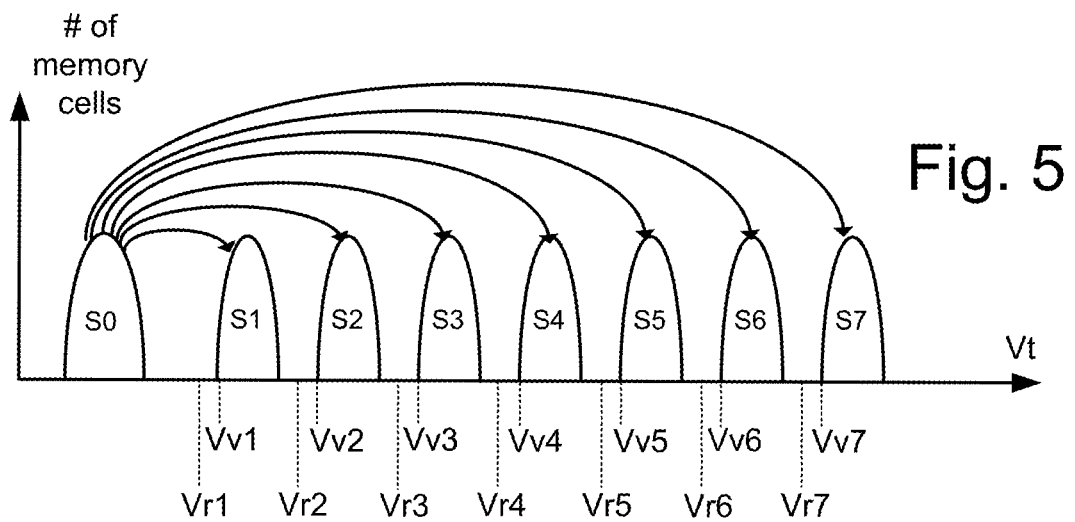
FIG. 5 depicts threshold voltage distributions.
FIG. 5A is a table describing one example of an assignment of data values to data states.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming) In some embodiments, data states S1-D7 can overlap, with Controller 122 relying on ECC to identify the correct data being stored.

FIG. 5A is a table describing one example of an assignment of data values to data states. In the table of FIG. 5A, S0=111, S1=110, S2=200, S3=000, S4=010, S5=011, S6=001 and S7=101. Other encodings of data can also be used. No particular data encoding is required by the technology disclosed herein.

Figure 6A:
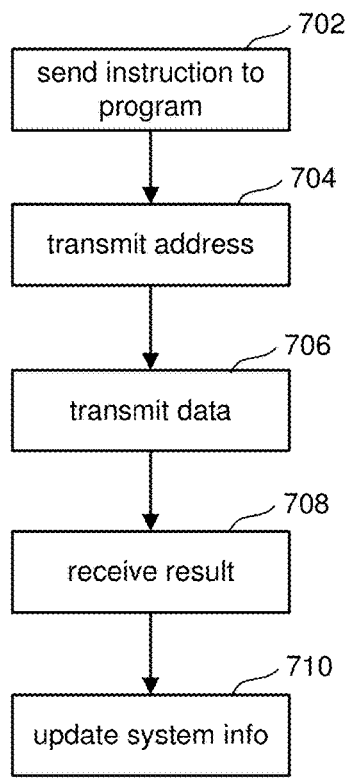
FIG. 6A is a flow chart describing one embodiment of a process for programming.

FIG. 6A is a flowchart describing one embodiment of a process for programming that is performed by Controller 122. In some embodiments, rather than have a dedicated controller, the host can perform the functions of the controller. In step 702, Controller 122 sends instructions to one or more memory die 108 to program data. In step 704, Controller 122 sends one or more logical addresses to one or more memory die 108. The one or more logical addresses indicate where to program the data. In step 706, Controller 122 sends the data to be programmed to the one or more memory die 108. In step 708, Controller 122 receives a result of the programming from the one or more memory die 108. Example results include that the data was programmed successfully, an indication that the programming operation failed, and indication that the data was programmed but at a different location, or other result. In step 710, in response to the result received in step 708, Controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, Controller 122 would receive user data and an instruction to program from the host, and the controller would run the ECC engine to create code words from the user data. These code words are the data transmitted in step 706. Controller can also scramble the data to achieve wear leveling with respect to the memory cells.

Figure 6B:
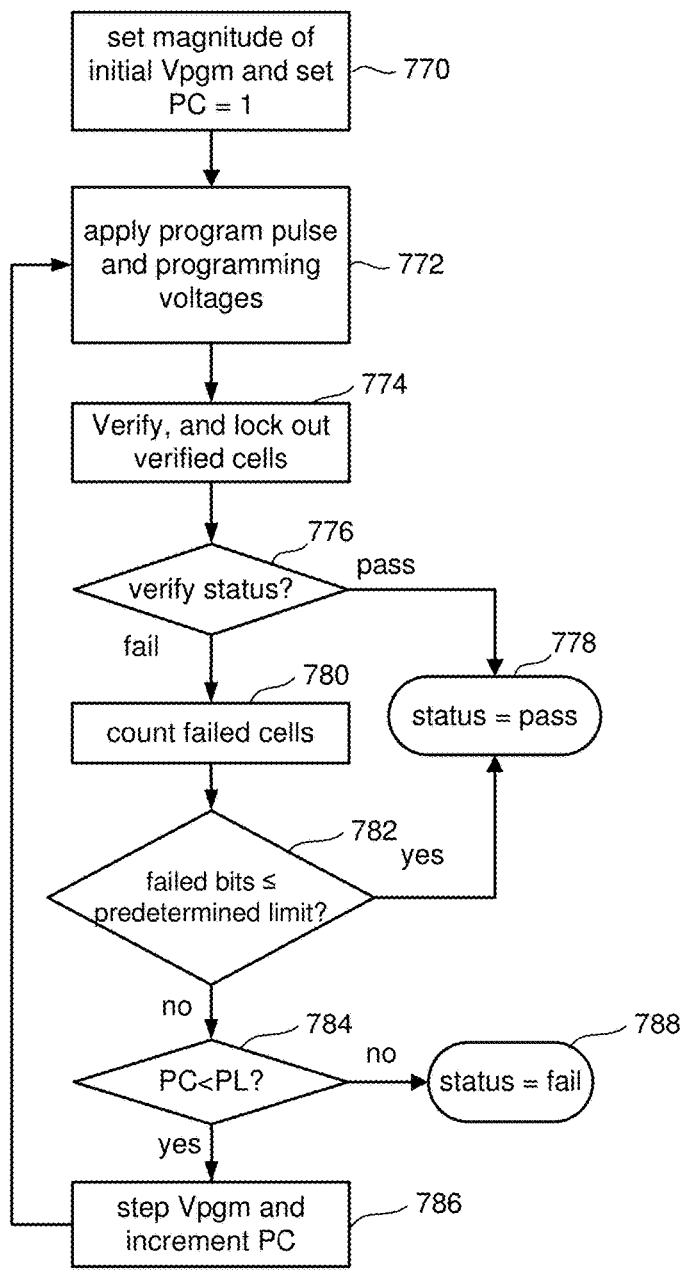
FIG. 6B is a flow chart describing one embodiment of a process for programming.

FIG. 6B is a flowchart describing one embodiment of a process for programming. The process of FIG. 6B is performed by the memory die in response to the steps of FIG. 6A (ie in response to the instructions, data and addresses from Controller 122). In one example embodiment, the process of FIG. 6B is performed on memory die 108 using the one or more control circuits discussed above, at the direction of state machine 112. The process of FIG. 6B can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 6B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming) In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

In one embodiment, data is programmed in units of pages. So, for example, the process of FIG. 6B is used to program one page of data. Because it is possible that errors can occur when programming or reading, and errors can occur while storing data (e.g., due to electrons drifting, data retention issues or other phenomenon), error correction is used with the programming of a page of data. FIG. 7 depicts an example of a page of data that can be programmed into three dimensional memory structure 126. This page of data includes error correction. For example, the page of data includes Header 802, User Data 804 and First Level parity 806. Header 802 stores various dearer information including logical address, condition data, etc. User Data 804 stores the data received from the user or host to be stored in the memory. First Level parity 806 stores one or more error correction codes.

Many ECC coding schemes are well known in the art. These conventional error correction codes are especially useful in large scale memories, including flash (and other non-volatile)memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, the Controller receives user data, also referred to as information bits, that is to be stored non-volatile three dimensional memory structure 126. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in the non-volatile storage 128 by programming one or more memory cells to one or more programming states, which corresponds to v.

In one possible implementation, an iterative probabilistic decoding process is used which implements error correction decoding corresponding to the encoding implemented in the Controller 122. Further details regarding iterative probabilistic decoding can be found in the above-mentioned D. MacKay text. The iterative probabilistic decoding attempts to decode a code word by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables. LLR values are measures of the reliability with which the values of various binary bits read from the storage elements are known.

The LLR for a bit is given by $$Q = \log_2 \frac{P(v=0|Y)}{P(v=1|Y)},$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

Controller 122 receives the code word Y1 and the LLRs and iterates in successive iterations in which it determines if parity checks of the error encoding process have been satisfied. If all parity checks have been satisfied, the decoding process has converged and the code word has been error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

Prior systems use one level of parity. That is one ECC system is used, as depicted in FIG. 7. It is proposed, however, to use two levels of parity. The first level of parity is used to create the page depicted in FIG. 7, similar to what was done in prior systems. The second level of parity is then created by using the page (the output of the first level of parity) as an input to create a second set of parity information. This second level of parity is used to guard against corruption of data due to defects in the memory. Rather than XOR full pages together, the proposed technology includes computing separate second level parity bits/information for each page (see FIG. 7). Then, the separate second level of parity information for each page is combined using any of various suitable functions, such as XOR or a Reed Solomon code, to create combined second level parity information.

After creating the combined second level parity information, the separate second level of parity information for each page are discarded. The combined second level parity information can be stored in the Controller 122 (see RAM 126 or RAM 216) or in the non-volatile memory cells of three dimensional memory structure 126.

FIG. 8 shows N pages of data, where each page is of the structure depicted in FIG. 7 and includes first level parity as depicted in FIG. 7. The set of pages Page 1, Page 2, Page 3, . . . Page N is referred to as a stripe. In one set of embodiments, a stripe can have between 32 and 256 pages; however, other amounts can also be used. In one embodiment, each page in a stripe is from a different block. In another embodiment, one or more of the pages in a stripe can be from the same block. FIG. 8 shows that for each page (Page 1, Page 2, Page 3, . . . Page N), where each page includes first level parity, separate second level parity information has been generated. For example, FIG. 8 shows Separate 2L Parity for Page 1 as the separate second level parity information generated for Page 1; Separate 2L Parity for Page 2 as the separate second level parity information generated for Page 2; Separate 2L Parity for Page 3 as the separate second level parity information generated for Page 3; and Separate 2L Parity for Page N as the separate second level parity information generated for Page N.

One or more functions are used to combine the separate second level parity information for all of the pages of a stripe to compute and create combined second level parity information (Combines 2L Parity). The technology described herein is not limited to any one particular function for combining the separate second level parity information, and various suitable functions can be used. One example function is XOR, such that all of the separate second level parity information for all of the pages of a stripe are XOR'd together to compute the combined second level parity information (Combines 2L Parity).

Controller 122 will cause each of the pages of the stripe (Page 1, Page 2, Page 3, . . . Page N) to be programmed into the memory cells of three dimensional memory structure 126. Controller 122 will store combined second level parity information (Combines 2L Parity) in its own memory (e.g., RAM 122*b* or 216) or in the memory cells of three dimensional memory structure 126. The separate second level parity information will not be saved. If it is later determined that one of the pages in the stripe that are stored in the three dimensional memory structure 126 have become corrupted, the Controller 122 can recover the corrupted page from the accessed corrupted page itself (including the user data and first level parity) and the stored combined second level parity information. That is, Controller 122 uses the corrupt data as part of the recovery process, which is on contrast to previous systems for recovering corrupt data. Additionally, storing combined second level parity information (which is a function of the page), rather than an XOR of the actual pages, also provides an improvement in the amount of space needed for the recovery mechanism, The parity technology used for the second level parity can be any of the ECC technologies described above, as well as any other suitable technologies known in the art. The proposed technology described herein does not require any specific ECC/parity technology for the first level of parity or the second level of parity. In some embodiments, the first level of parity and the second level of parity are implemented with the same ECC/parity technology, while in other embodiments the first level of parity and the second level of parity are implemented with the different ECC/parity technology.

The length of the second level parity (e.g., the number of additional bits generated), designed to be less than a full page (see FIG. 7), may be determined based on the expected error rate of a corrupted data page. This size is expected to be smaller than a full page size, which is required by a conventional scheme in order to recover one data page. Hence, reduced SRAM/DRAM memory in the Controller 122 can be used. This can significantly reduce the overall product cost, while still ensuring the required memory data integrity in the presence of memory defect. For example, if the expected error rate of a corrupted data page is ~10%, then a XORed parity section of ½ page size (i.e. 8 KB for 16 KB pages) will be sufficient for recovery of the corrupt data page. In case the corrupt memory cells can be identified and marked as "erasures" then an even smaller XORed parity section can be used; for example, for perfect erasure marking, a XORed parity section of ~⅙ will be sufficient for recovering the ~10% "erased" cells in the corrupt data page.

The description above refers to protection against a single corrupt page. Though, this can be generalized to any number of corrupt pages, in a similar manner to the way it is done for conventional schemes, where the stripe of data pages along which the XOR is performed, is defined in such a way that a memory defect will corrupt at most a single page per stripe. Then, the number of stripes (which, in one embodiment, is equal to the number of XOR pages) is determined according to the number of pages that are expected to be corrupted by a NAND defect.

Figure 9:
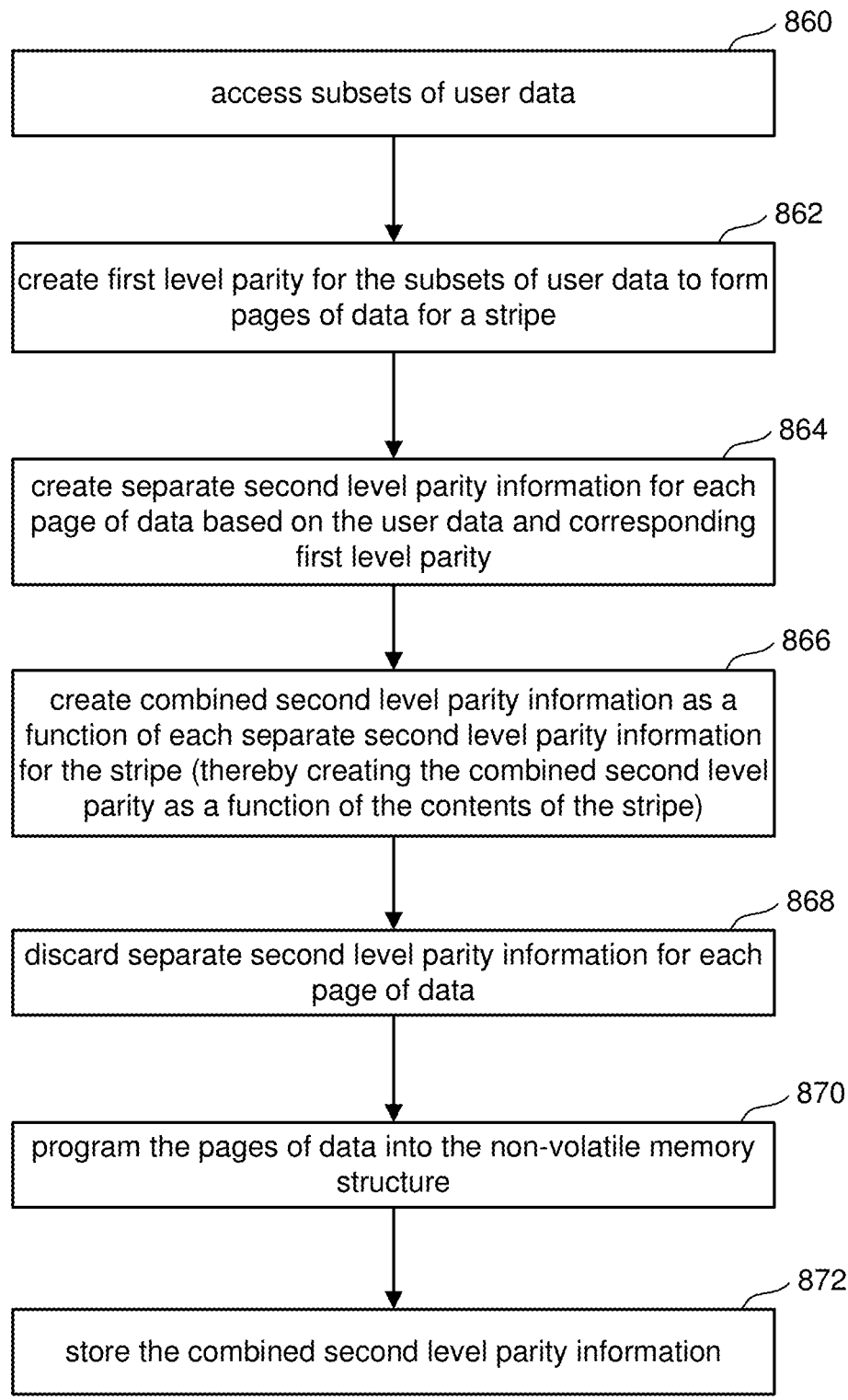
FIG. 9 is a flow chart describing one embodiment of a process for programming, including creating error correction codes/

FIG. 9 is a flow chart describing one embodiment of a process for programming data, including the creation of the two levels of parity. The process of FIG. 9 is performed by Controller 122 (see e.g., processor 122c and ROM 122a, or back end module 210 including ECC engine 225, RAID module 228 and Flash Control Layer 232). In another embodiment, the process of FIG. 9 is performed by control circuitry 110, such as state machine 112. Other components can also be used. The process of FIG. 9 is performed in response to receiving data to be programmed or otherwise as part of a programming process. In step 860, Controller 122 (or other device) accesses multiple subsets of user data. In one embodiment, a subset of data can be the unit of user data that is in one page (see FIG. 7). In other embodiments, the subset of data can be a different amount of data. In one example implementation, Controller access all of the user data for all of the pages that comprise one stripe. In step 862, Controller 122 (or other device) creates the first level parity for each of the subsets of user data to creates pages of data for a stripe. Each page of data includes user data (ie a subset of user data) and corresponding first level parity, as depicted in FIG. 7.

In step 864 of FIG. 9, Controller 122 (or other device) creates separate second level parity information for each page of data based on the user data and corresponding first level parity. For example, looking back at FIG. 8, one embodiment of step 864 comprises generating Separate 2L Parity for Page 1, 2L Parity for Page 2, Separate 2L Parity for Page 3, and Separate 2L Parity for Page N. In step 866, Controller 122 (or other device) creates combined second level parity information as a function of each separate second level parity information for the stripe (thereby creating the combined second level parity as a function of the contents of the stripe). For example, looking back at FIG. 8, one embodiment of step 864 comprises generating Combined 2L Parity. At the conclusion of step 868, the data structure of FIG. 8 has been constructed. In step 868, Controller 122 (or other device) discards the separate second level parity information for each page of data in the stripe.

In one embodiment, steps 864, 866 and 868 can be performed by ECC engine 224 or RAID module 228 (both of which can be implemented as electrical circuits or a combination of hardware [processor or other control logic] and software).

In step 870, Controller 122 (or other device) programs the pages of data into the non-volatile memory structure, for example, using the processes of FIGS. 6A and 6B (one or multiple times). In step 872, Controller 122 (or other device) stores the combined second level parity information for the stripe. In one embodiment, the combined second level parity information is stored at the Controller (e.g., RAM 122b or 216). In another embodiment, the combined second level parity information is stored in memory cells of three dimensional memory structure 126. In some embodiments, the combined second level parity information is stored on a temporary basis at the Controller (or elsewhere) until a time after causing the programming of the multiple pages into the non-volatile storage and determining that the none of the multiple sets of programmed data are corrupted. When programming large amounts of data, the process of FIG. 9 may be performed multiple times, serially or in parallel, for multiple stripes (or other units of data).

Figure 10:
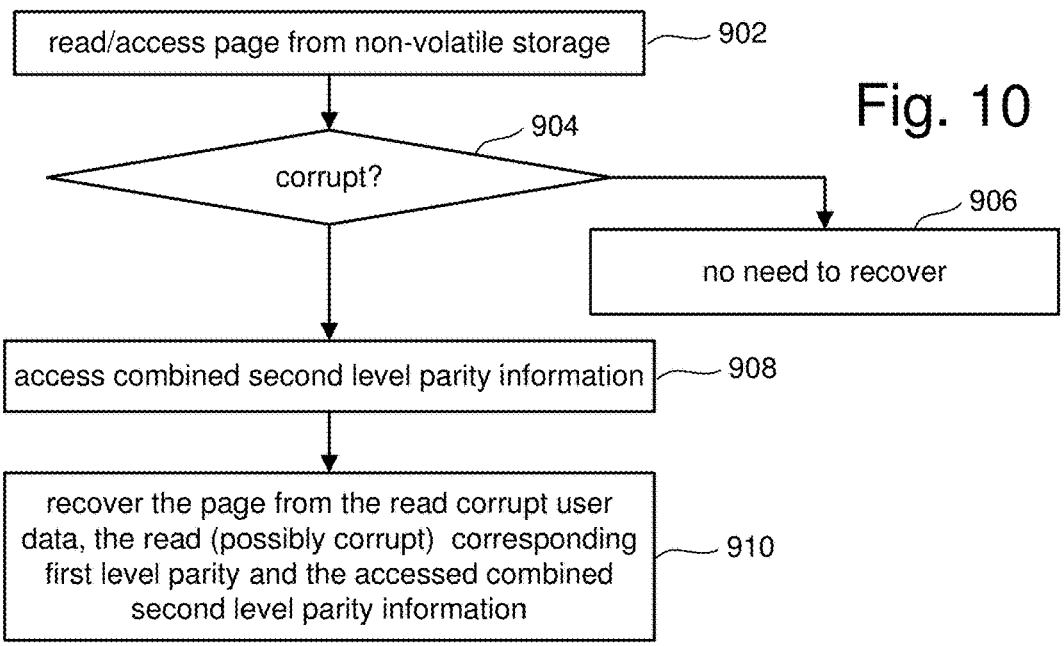
FIG. 10 is a flow chart describing one embodiment of a process for recovering data.

FIG. 10 is a flow chart describing one embodiment of a process for reading data stored in the three dimensional memory structure 126. The process of FIG. 10 is performed by Controller 122 (see e.g., processor 122c and ROM 122a, or back end module 210). In another embodiment, the process of FIG. 10 is performed by control circuitry 110, such as state machine 112. Other components can also be used. The process of FIG. 10 is performed in response to a request from the host to read data or another need to read data (such as various memory management functions). The process of FIG. 10 can also be performed immediately after programming the subject data or data nearby. Additionally, the process of FIG. 10 can also be performed periodically to test for corrupt data.

In step 902 of FIG. 10, Controller 122 (or other device) read (or otherwise access) a page from three dimensional non-volatile memory structure 126 using, for example, any appropriate read process known in the art. In step 904, Controller 122 (or other device) determines whether the data read in step 902 is corrupt. There are many suitable tests known in the art for determining whether data is corrupt. One example is if ECC engine 224 can properly decode the data then the data is not corrupt and if ECC engine 224 cannot properly decode the data then the data is corrupt. Other tests can also be used. If the data is not corrupt, then there is no need to recover the data (step 906). However, if the data is determined to be corrupt, then in step 908 the Controller 122 (or other device) accesses the combined second level parity information from where it is being stored (e.g., three dimensional non-volatile memory structure 126, RAM 122b, RAM 216, etc.). In step 910, Controller 122 (or other device) recovers the user data for the page (ie the subset of data mentioned above) from the read corrupt user data, the read (possibly corrupt) first level parity and the accessed combined second level parity information.

Figure 11:
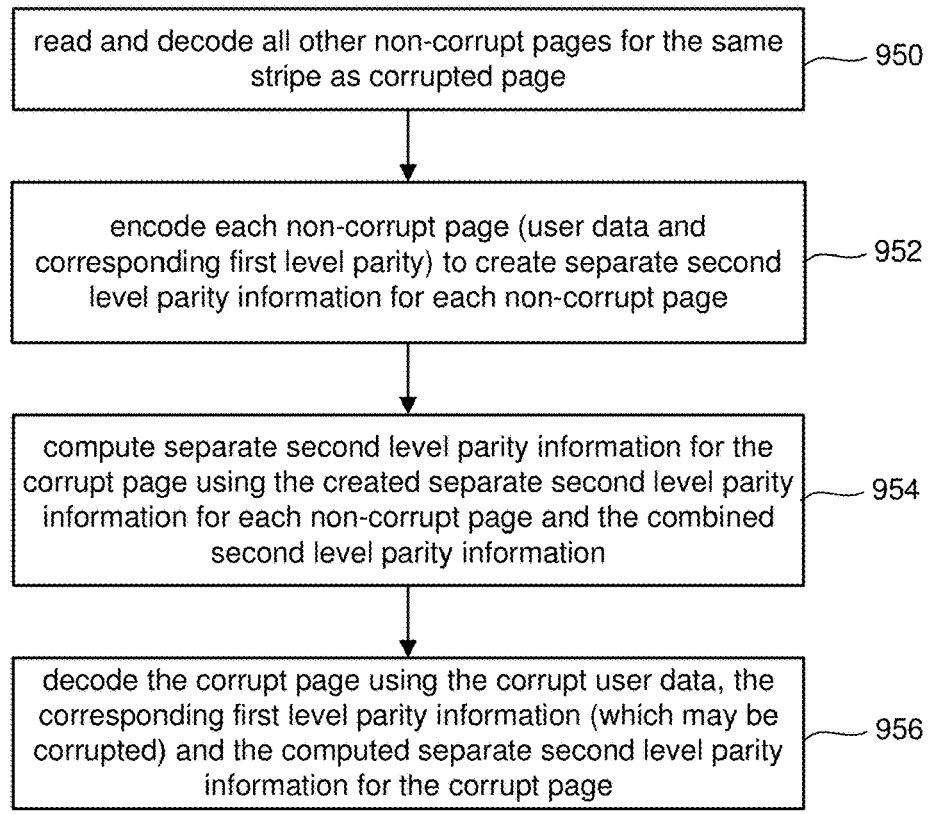
FIG. 11 is a flow chart describing more details of one embodiment for recovering data.

FIG. 11 is a flow chart describing one embodiment of a process for recovers user data. The process of FIG. 11 is one example implementation of step 910 of FIG. 10. The process of FIG. 11 is performed by Controller 122 (see e.g., processor 122c and ROM 122a, or back end module 210 including ECC engine 225, RAID module 228 and Flash Control Layer 232). In another embodiment, the process of FIG. 11 is performed by control circuitry 110, such as state machine 112. Other components can also be used.

In step 950 of FIG. 11, Controller 122 (or other device) reads and decodes all other pages for the same stripe that contains the corrupt page. The decoding is done according to the ECC technology used to create the first level parity. The result of the decoding should be the valid user data for the page. One purpose of step 950 is to ensure that the other pages of the strip are not corrupted. In step 952, Controller 122 (or other device) encodes each of the pages (user data and corresponding first level parity) of the strip, other than the corrupted page, to create separate second level parity information for each non-corrupt page. Step 952 of FIG. 11 is similar to step 864 of FIG. 9, with the exception that step 952 does not create new separate second level parity information for the corrupt page. In step 954, Controller 122 (or other device) will derive the separate second level parity information for the corrupt page by using the separate second level parity information for each non-corrupt page and the combined second level parity (accessed in step 908). For example, if the function used to create the combined second level parity in step 866 was XOR, then the system can use the XOR function with the separate second level parity information for each non-corrupt page and the combined second level parity in step 954 to derive the separate second level parity information for the corrupt page. In step 956, Controller 122 (or other device) will use the second level parity technology to decode the corrupt page using the corrupt user data, the corresponding first level parity information (which may be corrupted) and the computed separate second level parity information for the corrupt page. The result of step 956 is to recover the user data for the corrupted page. The process of step 956 has a higher rate of success than other ECC processes because it is uses two sets of parity (first level and second level) as well as the corrupted data.

One embodiment includes an apparatus comprising a memory interface circuit configured to communicate with non-volatile storage; and a control circuit connected to the memory interface circuit. The control circuit is configured to access a first set of programmed data from non-volatile storage. The first set of programmed data includes a first subset of data and corresponding first level parity. The control circuit is configured to access combined second level parity information that reflects the contents of multiple sets of programmed data. Each set of programmed data includes a subset of data and corresponding first level parity. The multiple sets of programmed data include the first set of programmed data. The control circuit is configured to recover the first subset of data from the accessed corrupt first subset of data, the accessed first level parity and the accessed combined second level parity information if the first subset of data is corrupt.

One embodiment includes an apparatus comprising a plurality of non-volatile memory cells; and a control circuit in communication with the memory cells. The control circuit is configured to create first level of parity for subsets of data to create sets of programmable data. Each set of programmable data includes a subset of data and corresponding first level parity. The control circuit is configured to create separate second level parity information for each set of programmable data that is based on corresponding subset of data and first level parity. The control circuit is configured to create combined second level parity information as a function of the separate second level parity information for each set of programmable data. The combined second level parity information is smaller in length than any of the sets of programmable data. The control circuit is configured to cause the programming of the sets of programmable data into the memory cells and store the combined second level parity information.

One embodiment includes a method comprising: reading a corrupt subset of data and its corresponding first level parity; reading and decoding non-corrupt subsets of data of multiple sets of programmable data, each set of programmable data includes a subset of data and corresponding first level parity, the non-corrupt subsets of data are decoded using their corresponding first level parity; encoding non-corrupt subsets of data and corresponding first level parity to create separate second level parity information for the non-corrupt subsets of data; computing separate second level parity information for the corrupt subset of data using the created separate second level parity information for the non-corrupt subsets of data and combined second level parity information, the combined second level parity information is a function of second level parity information for each non-corrupt subset of data and separate second level parity information for the corrupt subset of data; and decoding the corrupt subset of data from the read corrupt subset of data, the corresponding first level parity for the corrupt subset of data that was read and the computed separate second level parity information for the corrupt subset of data.

One embodiment includes a method comprising accessing a first set of programmed data from non-volatile storage, the first set of programmed data includes a first subset of data and corresponding first level parity; accessing combined second level parity information that reflects the contents of multiple sets of programmed data, each set of programmed data includes a subset of data and corresponding first level parity, the multiple sets of programmed data include the first set of programmed data; and recovering the first subset of data from the accessed corrupt first subset of data, the accessed first level parity and the accessed combined second level parity information if the first subset of data is corrupt.

One embodiment includes an apparatus comprising means for creating combined second level parity information based on a function of separate second level parity information for multiple sets of programmable data, each set of programmable data includes a subset of data and corresponding first level parity; means for causing the programming of sets of programmable data into non-volatile storage and causing the storage of the combined second level parity information; and means for recovering a corrupt subset of data using the corrupt subset of data read from the non-volatile storage, corresponding first level parity read from the non-volatile storage and the combined second level parity information.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a control circuit configured to communicate with non-volatile storage,
the control circuit is configured to access a corrupted first set of programmed data from non-volatile storage, the corrupted first set of programmed data includes a first subset of data and corresponding first level parity for the first subset of data,
the control circuit is configured to access combined second level parity information for multiple sets of programmed data, each set of programmed data includes a subset of data and corresponding first level parity, the multiple sets of programmed data include the first set of programmed data;
the control circuit configured to recover the corrupted first set of programmed data by:
reading non-corrupt sets of programmed data of the multiple sets of programmed data,
creating separate second level parity information for the non-corrupt sets of programmed data,
computing separate second level parity information for the corrupted first set of programmed data using the created separate second level parity information for the non-corrupt sets of programmed data and the accessed combined second level parity information, and
decoding the corrupted first set of programmed data using the accessed first level parity for the first subset of data and the computed separate second level parity information for the corrupted first set of programmed data.

2. The apparatus of claim 1, wherein:
the control circuit is configured to create the combined second level parity information from the multiple sets of programmed data; and
the control circuit is configured to cause the programming of the multiple sets of programmed data into the non-volatile storage and cause the storage of the combined second level parity information.

3. The apparatus of claim 2, wherein:
the control circuit is configured to create the corresponding first level parity for the subsets of data of the multiple sets of programmed data.

4. The apparatus of claim 2, wherein:
the control circuit is configured to test whether the first set of programmed data is corrupted after causing the programming of the multiple sets of programmed data into the non-volatile storage.

5. The apparatus of claim 2, wherein:
the control circuit is a controller for the non-volatile storage and is configured to temporarily store the combined second level parity information at the controller until a time after causing the programming of the multiple sets of programmed data into the non-volatile storage and determining that none of the multiple sets of programmed data are corrupted.

6. The apparatus of claim 2, wherein:
the control circuit is configured to cause the programming of the combined second level parity information in the non-volatile storage.

7. The apparatus of claim 1, wherein:
the control circuit configured to determine that the first set of programmed data is corrupted;
the control circuit is configured to read the non-corrupt sets of programmed data from the non-volatile storage;
the control circuit is configured to create the separate second level parity information for the non-corrupt sets of programmed data from the read non-corrupt sets of programmed data; and
the control circuit is configured to create the separate second level parity information after and in response to determining that the first set of programmed data is corrupted.

8. The apparatus of claim 1, wherein:
the control circuit is configured to create the separate second level parity information for the non-corrupt sets of programmed data based on contents of the multiple sets of programmed data
the control circuit is configured to XOR together the separate second level parity information in order to create the combined second level parity information; and
the control circuit is configured to cause the programming of the multiple sets of programmed data into the non-volatile storage and cause the storage of the combined second level parity information.

9. The apparatus of claim 1, further comprising:
a plurality of memory cells arranged in a three dimensional array, the memory cells comprise the non-volatile storage.

10. The apparatus of claim 1, wherein:
the control circuit is part of a controller that is connected to the non-volatile storage;
the controller includes a memory interface and a host interface, the memory interface configured to communicate with the non-volatile storage, the host interface configured to communicate with a host; and
the controller is configured to store the multiple sets of programmed data in different blocks of the non-volatile storage so that a defect that corrupts the first subset of data will not corrupt the multiple sets of programmed data in different physical pages.

11. A method comprising:
reading a corrupt subset of data and its corresponding first level parity;
reading and decoding non-corrupt subsets of data of multiple sets of programmable data, each set of programmable data includes a subset of data and corresponding first level parity, the non-corrupt subsets of data are decoded using their corresponding first level parity;

encoding the non-corrupt subsets of data and corresponding first level parity to create separate second level parity information for the non-corrupt subsets of data after the reading and decoding of the non-corrupt subsets of data;

computing separate second level parity information for the corrupt subset of data using the created separate second level parity information for the non-corrupt subsets of data and combined second level parity information, the combined second level parity information is based on second level parity information for the non-corrupt subsets of data and separate second level parity information for the corrupt subset of data; and decoding the corrupt subset of data from the read corrupt subset of data, the corresponding first level parity for the corrupt subset of data that was read and the computed separate second level parity information for the corrupt subset of data.

12. The method of claim 11, further comprising:

creating the combined second level parity information from separate second level parity information for the multiple sets of programmable data; and causing the programming of sets of programmable data into non-volatile storage and causing the storage of the combined second level parity information.

13. The method of claim 12, wherein:

the creating the combined second level parity information is performed by an XOR function of the second level parity information for the multiple sets of programmable data; and the combined second level parity information is shorter in length than each set of programmable data.

14. The method of claim 11, further comprising:

the reading the corrupt subset of data and its corresponding first level parity includes reading the corrupt subset of data from a three dimensional data structure and determining that the corrupt subset of data is corrupt.

15. An apparatus, comprising:

means for creating combined second level parity information from separate second level parity information for multiple sets of programmable data, each set of programmable data includes a subset of data and corresponding first level parity;

means for causing the programming of sets of programmable data into non-volatile storage and causing the storage of the combined second level parity information; and means for recovering a corrupt subset of data by decoding other subsets of non-corrupt data, creating separate second level parity information for the decoded other subsets of non-corrupt data based on the decoded other subsets of non-corrupt data and corresponding first level parity for the respective decoded other subset of non-corrupt data, deriving separate second level parity information for the corrupt subset of data by using the created separate second level parity information for the decoded other subsets of non-corrupt data and the combined second level parity information, decoding the corrupt data using the derived separate second level parity information for the corrupt subset of data.

* * * * *